United States Patent
Tsai et al.

(10) Patent No.: US 8,926,806 B2
(45) Date of Patent: Jan. 6, 2015

(54) SHIELDING DESIGN FOR METAL GAP FILL

(75) Inventors: Ming-Chin Tsai, Hsinchu (TW);
Bo-Hung Lin, Kaohsiung (TW);
You-Hua Chou, Taipei (TW);
Chung-En Kao, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 73 days.

(21) Appl. No.: 13/355,770

(22) Filed: Jan. 23, 2012

(65) Prior Publication Data

US 2013/0186338 A1      Jul. 25, 2013

(51) Int. Cl.
*C23C 14/22* (2006.01)
*C23C 14/58* (2006.01)

(52) U.S. Cl.
CPC .................................. *C23C 14/5806* (2013.01)
USPC ............ 204/298.09; 204/298.12; 204/192.12; 204/298.25; 438/696; 118/719

(58) Field of Classification Search
CPC ................................................... C23C 14/5806
See application file for complete search history.

(56) References Cited

U.S. PATENT DOCUMENTS

| | | | | |
|---|---|---|---|---|
| 3,294,670 A | * | 12/1966 | Charschan et al. | 204/298.25 |
| 4,874,723 A | * | 10/1989 | Jucha et al. | 438/696 |
| 5,556,472 A | * | 9/1996 | Nakamura et al. | 118/719 |
| 5,693,199 A | * | 12/1997 | Bourez et al. | 204/192.12 |
| 6,030,510 A | * | 2/2000 | Kobayashi et al. | 204/192.12 |
| 6,238,533 B1 | | 5/2001 | Satitpunwaycha et al. | |
| 6,589,865 B2 | | 7/2003 | Dixit et al. | |
| 7,182,816 B2 | | 2/2007 | Kleshock et al. | |
| 7,378,002 B2 | | 5/2008 | Lee et al. | |
| 7,949,237 B2 | | 5/2011 | Koren et al. | |
| 2005/0039679 A1 | | 2/2005 | Kleshock et al. | |
| 2008/0116067 A1 | * | 5/2008 | Lavitsky et al. | 204/298.12 |

FOREIGN PATENT DOCUMENTS

| | | |
|---|---|---|
| KR | 20020089592 A | 11/2002 |
| KR | 20060065703 A | 6/2006 |

* cited by examiner

*Primary Examiner* — Keith Hendricks
*Assistant Examiner* — Timon Wanga
(74) *Attorney, Agent, or Firm* — Eschweiler & Associates, LLC (57) ABSTRACT

The present disclosure is directed to a physical vapor deposition system configured to heat a semiconductor substrate or wafer. In some embodiments the disclosed physical vapor deposition system comprises at least one heat source having one or more lamp modules for heating of the substrate. The lamp modules may be separated from the substrate by a shielding device. In some embodiments, the shielding device comprises a one-piece device or a two piece device. The disclosed physical vapor deposition system can heat the semiconductor substrate, reflowing a metal film deposited thereon without the necessity for separate chambers, thereby decreasing process time, requiring less thermal budget, and decreasing substrate damage.

20 Claims, 8 Drawing Sheets

SHIELDING DESIGN FOR METAL GAP FILL

BACKGROUND

Integrated chips are formed by complex fabrication processes, during which a workpiece is subjected to different steps to form one or more semiconductor devices. Some of the processing steps may comprise formation of a thin film onto the semiconductor substrate. Thin films can be deposited onto a semiconductor substrate in a low pressure processing chamber using physical vapor deposition.

Physical vapor deposition is typically performed by acting on a target material to convert the target into a vapor. Often, a target material is acted upon by a plasma comprising a plurality of high energy ions. The high energy ions collide with the target material, dislodging particles into the vapor. The vapor is transported to a semiconductor substrate, upon which the vapor accumulates to form a thin film.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Modern semiconductor devices generally involve multiple layers separated by dielectric (insulating) layers, often referred to simply as an oxide layer. The layers are electrically interconnected by holes penetrating the intervening oxide layer which contact some underlying conductive feature. After the holes are etched, they are filled with a metal, such as aluminum or copper, to electrically connect the bottom layer with the top layer. The generic structure is referred to as a plug.

Filling such a hole with a metal elicits certain difficulties, including filling the hole without forming an included void. Any included void decreases the conductivity through the plug and introduces reliability issues. Physical vapor deposition ("PVD") or sputtering, is one of the most commonly used processes for filling of these openings owing to its fast deposition rates. PVD is a plasma process performed in a vacuum process chamber where a negatively biased target with respect to a chamber body or a grounded sputter shield is exposed to a plasma of a gas mixture comprising gases such as inert gases (e.g., argon (Ar)). Bombardment of the target by ions of the inert gas results in ejection of atoms of the target material. In some case, a magnetron is positioned in the back of the target to project a magnetic field parallel to the front side of the target to trap electrons and increase plasma density and sputtering rate. The ejected atoms accumulate as a deposited film on a substrate placed on a substrate pedestal disposed within the process chamber.

PVD, however, does not inherently conformally coat a deep and narrow opening. One approach for applying PVD to deep openings is to sputter the metal on a hot substrate so that the deposited material naturally flows into the narrow and deep feature. This process is typically referred to as reflow. However, high temperature reflow, e.g, greater than 400° C., results in a high thermal budget, as well as being detrimental to previously formed layers on the device and often requires the use of more than one chamber, thereby increasing processing time owing to the necessity of having to move the wafer from one chamber to another.

Accordingly, the present disclosure is directed to a physical vapor deposition system configured to heat a semiconductor substrate or wafer. In some embodiments the disclosed physical vapor deposition system comprises at least one heat source having one or more lamp modules configured to reflow a metal film deposited on the substrate. The lamp modules may be thermally separated from the substrate by a shielding device. In some embodiments, the shielding device comprises a one-piece device or a two piece device. The disclosed physical vapor deposition system can heat the semiconductor substrate, reflowing a metal film deposited thereon without the necessity for separate chambers, thereby decreasing process time, requiring less thermal budget, and decreasing substrate damage.

In general, embodiments of the disclosure contemplate the heat source be defined by one or more lamp modules which include a plurality of individual lamps emitting a wavelength of light in the visible spectrum. Lamps create a rapid isothermal processing system that provide instantaneous energy, typically requiring a very short and well controlled start up period. The lamps may include, for example, high intensity discharge lamps, incandescent lamps, gas discharge lamps, and electron-stimulated lamps, among others. The lamps may be turned on and off quickly, such as when a wafer temperature set point is reached. The lamps may be controlled variably by adjusting the power supplied by a power controller, thereby increasing or decreasing the radiant energy being emitted by any of the lamps. Additionally, each lamp modules may have multiple zones made up of a plurality of individual lamps. In this manner, the light energy emitted by each module may be controlled by turning single or multiple zones in the lamp modules on or off. The lamps will generally range in power from about 1 k Watts to about 100 k Watts, capable of very rapid wafer heating, for example, from 0° C. up to 700° C. in ten seconds. Lamp light angle may also be adjusted to control wafer temperature.

Figure 1A:
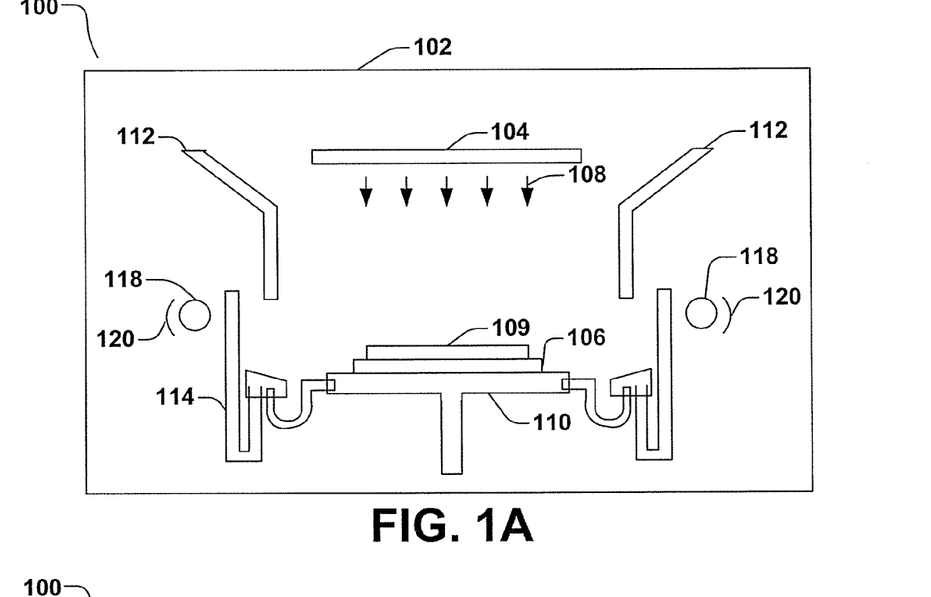
FIGS. 1A-1C illustrate a cross-sectional view of a physical vapor deposition system in accordance with an embodiment of the disclosure.

As shown in FIG. 1A, there is illustrated a first embodiment of a physical vapor deposition system including a processing chamber 100 defined by chamber walls 102. A pedestal 110, which is usually temperature-controlled, is configured to support a wafer or other semiconductor substrate 106 to be sputter coated 108. A PVD target 104 configured to provide target atoms is positioned within the chamber 100 in opposition to the substrate 106 being sputter coated 108 with a layer of a PVD metal film 109. The metal film 109 will generally be aluminum or copper. A two-piece shielding device comprising an upper shielding portion 112 and a lower shielding portion 114 protects the chamber walls 102 and the sides of the pedestal 110 from sputter deposition, as well as thermally separating a heat source from the substrate. For aluminum sputtering, for example, at least the front face of the target 104 facing the substrate 106 is composed of aluminum or aluminum alloy. A controllable chiller 116 may circulate chilled water or other refrigerated liquid to a cooling channel (not shown) formed in the pedestal 110. At least one heat source comprising one or more lamp modules 118 is positioned adjacent to the lower portion 114 of shielding and between lower shielding 114 and chamber wall 102. One or more reflecting devices 120 are associated with each lamp module in order to assist in directing the light energy being emitted by lamp modules 118 onto the substrate 106. Reflecting devices 120 may include a reflector or set of reflectors. Reflecting devices 120 can be made from any material suitable for reflecting light energy and can have any suitable shape that will assist in directing the light energy emitted by lamp modules 118 toward the substrate 106. Reflecting devices 120 may be adjustable such that the path of the light emitted from the lamp modules may be changed.

Figure 1B:
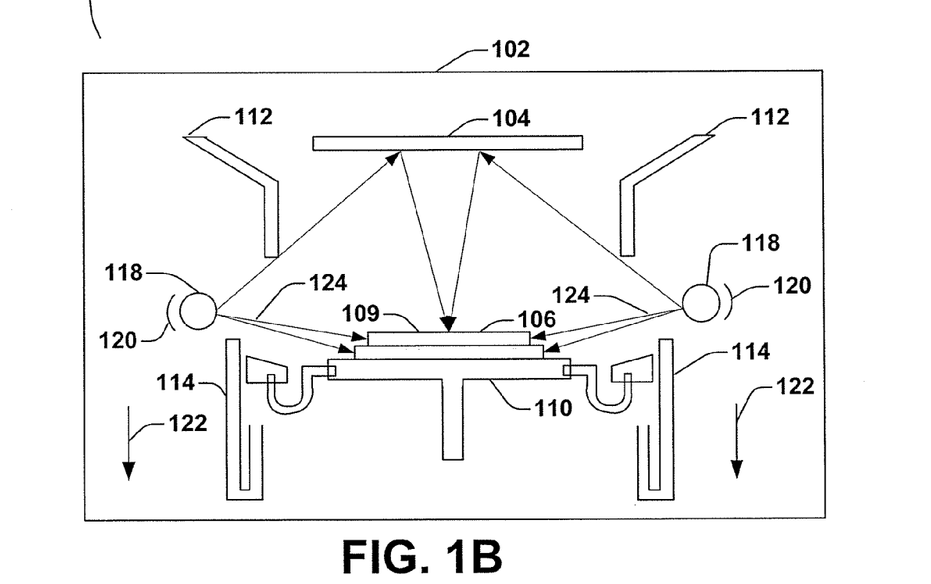

During operation of the chamber 100 following sputter coating 108 of the substrate 106, a rapid thermal process is initiated to heat the substrate 106 and reflow the sputtered coating 108. As illustrated in FIG. 1B, shielding lower portion 114 is moved in a downward direction as indicated by arrows 122, exposing lamp modules 118. The lamp modules 118 may be electrically connected to each other and controlled by a control system, which controls when each of the various radiant heat sources is illuminated. Control system is typically, but not limited to, a computer processing system such as a PC or workstation. As illustrated in FIG. 1B, lamp modules 118 are partially surrounded by a reflecting device 120. Light energy 124 emitted by lamp modules 118 is directed onto wafer by reflecting devices 120.

Figure 1C:
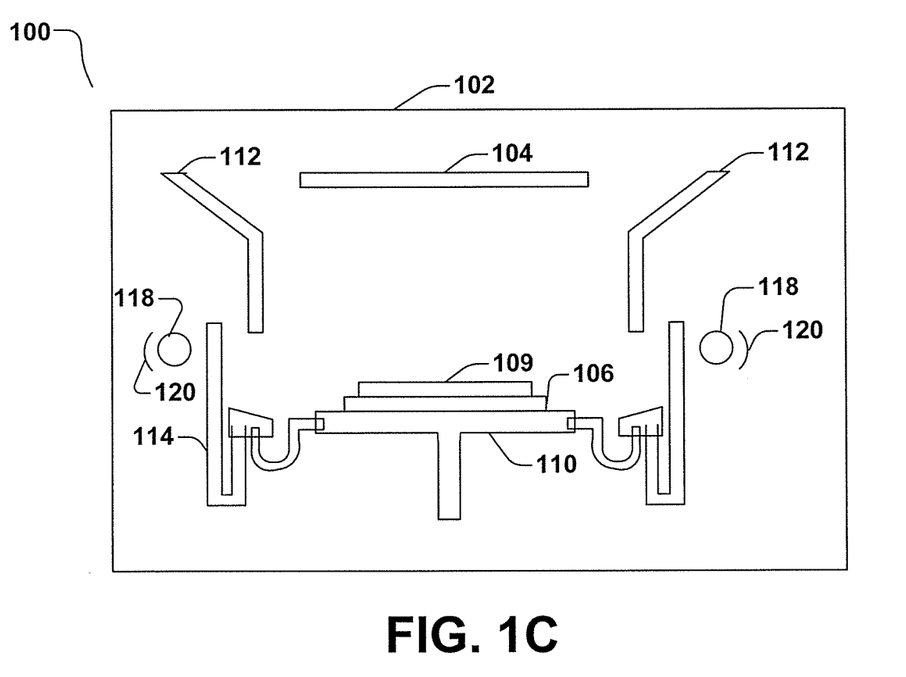

After a predetermined time, lamp modules 118 may be turned off and shielding lower portion 114 is raised, as illustrated in FIG. 1C. Substrate 106 is then cooled by circulation of chilled water or other refrigerated liquid through pedestal 110.

Figure 2A:
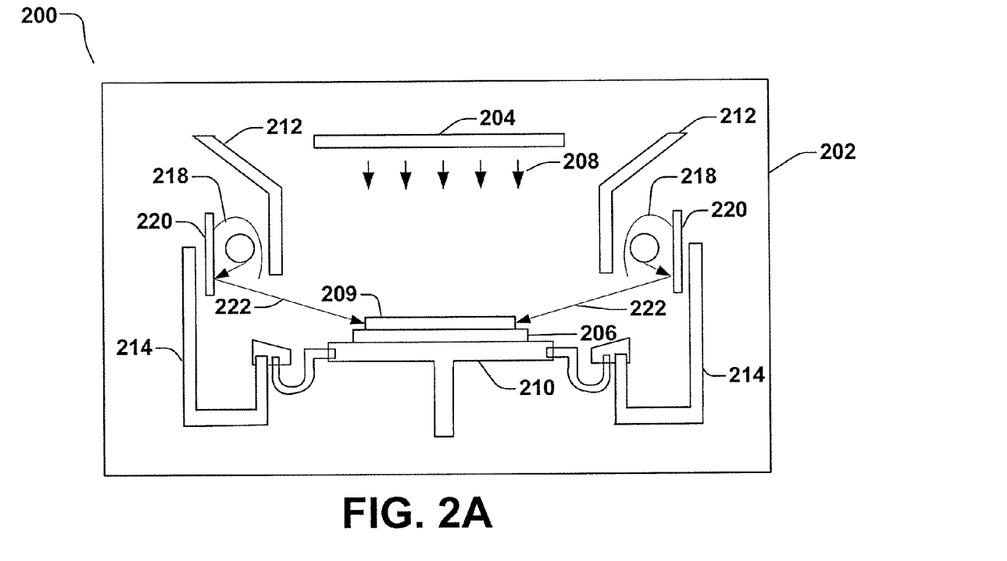
FIGS. 2A-2B illustrates a cross-sectional view of a further embodiment of a physical vapor deposition system.
Figure 2B:
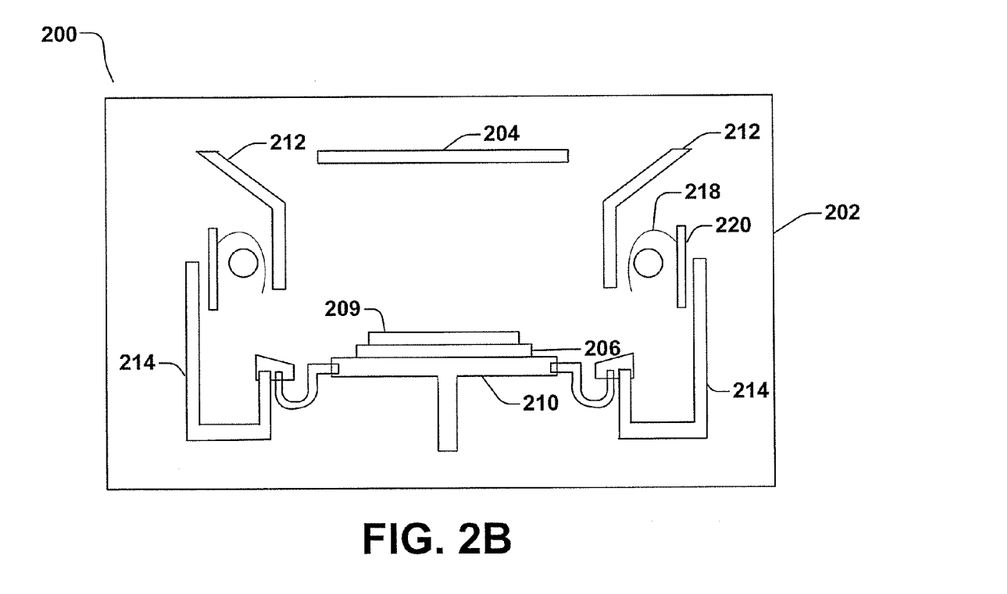

In FIG. 2A there is illustrated a further embodiment of the physical vapor deposition system disclosed herein. System includes a processing chamber 200 formed by chamber walls 202. One or more lamp modules 218 are positioned between upper shielding portion 212 and lower shielding portion 214. Lamp modules 218 include a reflecting device 220. Reflecting device 220 focuses light energy 222 emitted by lamp modules 218 to surface of substrate 206 held on pedestal 210, and reflow metal film 209 thereon. Following reflow of the metal film 209, lamp modules 218 may be turned off. The substrate 206 is then cooled through pedestal 210 as illustrated in FIG. 2B.

Figure 3A:
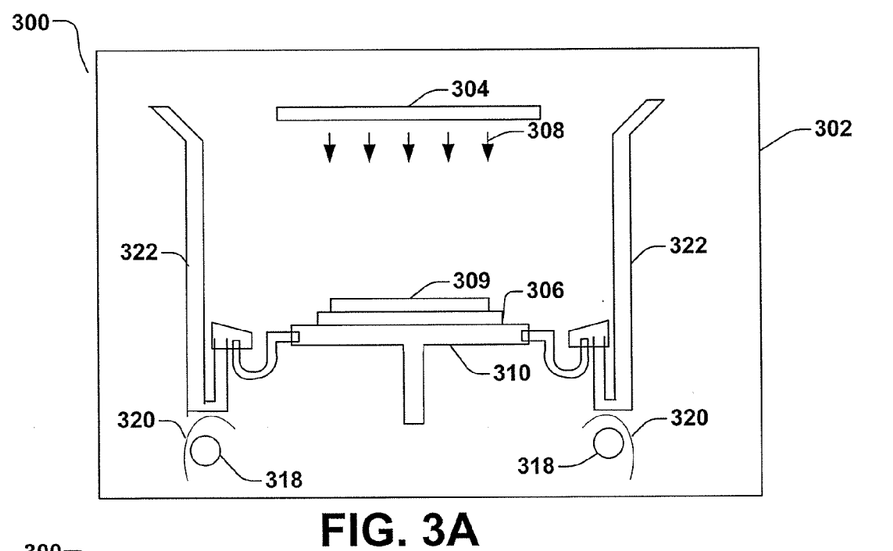
FIGS. 3A-3C illustrates a cross-sectional view of a physical vapor deposition system having a one-piece shielding design.
Figure 3B:
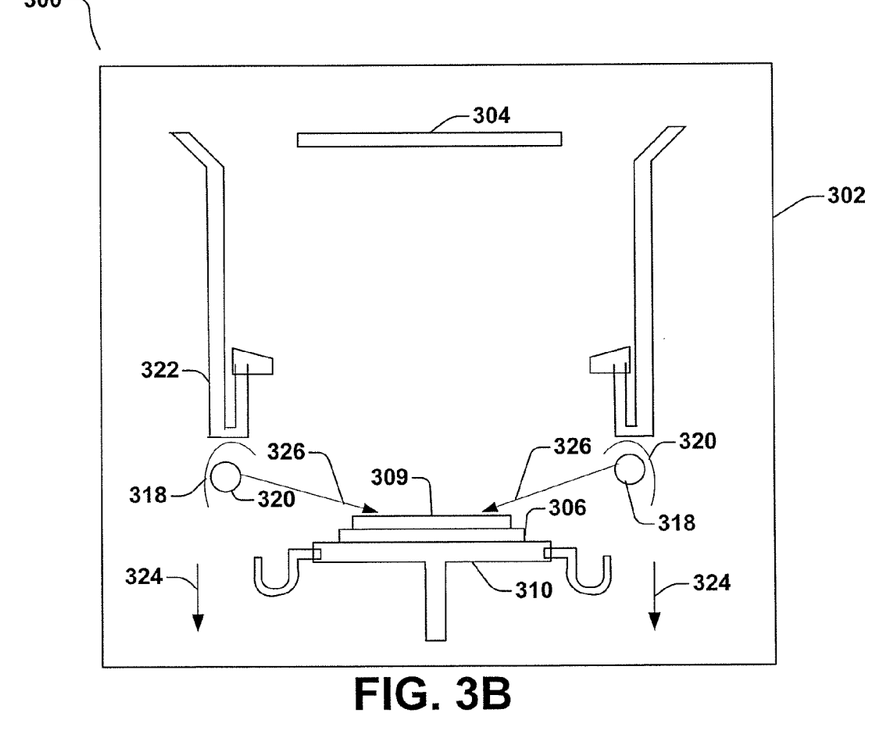
Figure 3C:
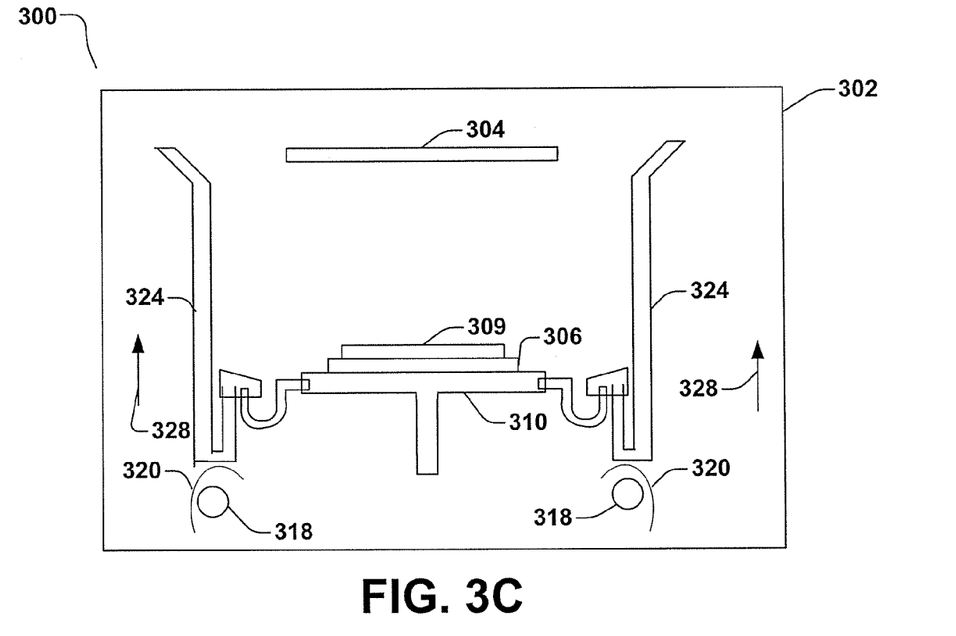

A further embodiment of the physical vapor deposition system disclosed herein is illustrated in FIG. 3A. In this embodiment, lamp modules 318 are positioned below a one-piece shielding device 322 within chamber walls 302. Following sputtering 308 of target atoms from target 304 onto substrate 306 to form film 309, pedestal 310 is lowered as shown by directional arrows 324 in FIG. 3B. A reflow of the metal film 309 is accomplished by rapid thermal heating by lamp modules 318. Light energy 326 emitted by lamp modules 318 may be reflected from reflecting device 320 and directed to surface of substrate 306. Upon completion of the reflow process, the lamp modules may be turned off and the pedestal is raised as indicated by directional arrows 328 in FIG. 3C. Substrate 306 is then cooled by circulation of chilled water or other refrigerated liquid through pedestal 310.

Figure 4A:
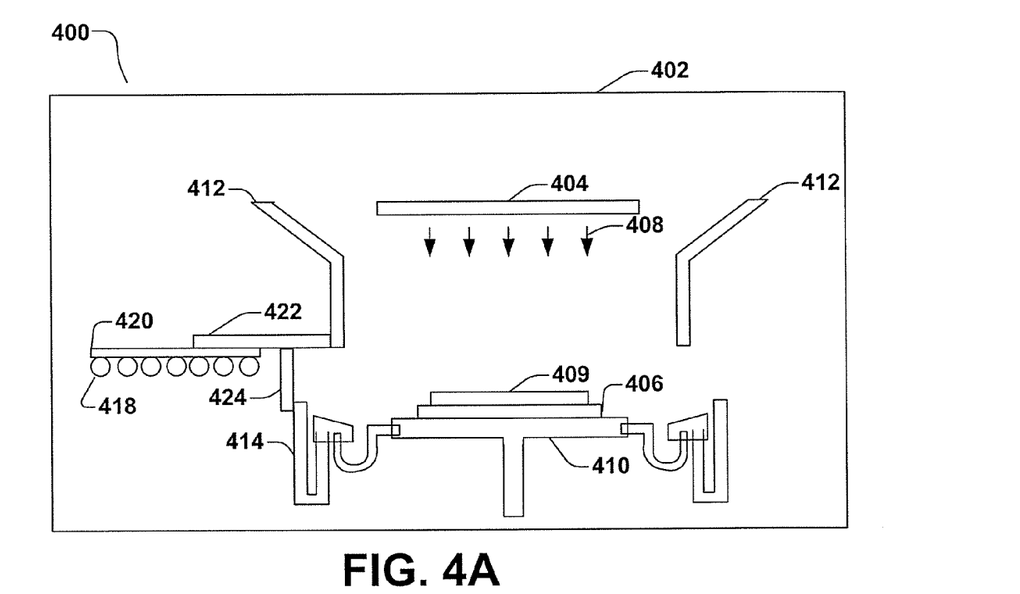
FIG. 4A-4C illustrates a cross-sectional view of an embodiment of a physical vapor deposition system having a rotateably moveable transfer arm.

FIG. 4A illustrates a still further embodiment of the physical vapor deposition system disclosed herein. In FIG. 4A, lamp modules 418 are supported on a mounting bracket 420. Mounting bracket 420 is affixed to a rotateably moveable transfer arm 422. Transfer arm 422 may be housed in a side chamber (not shown). Transfer arm can be rotated into processing chamber 400 through slit valve 424.

Figure 4B:
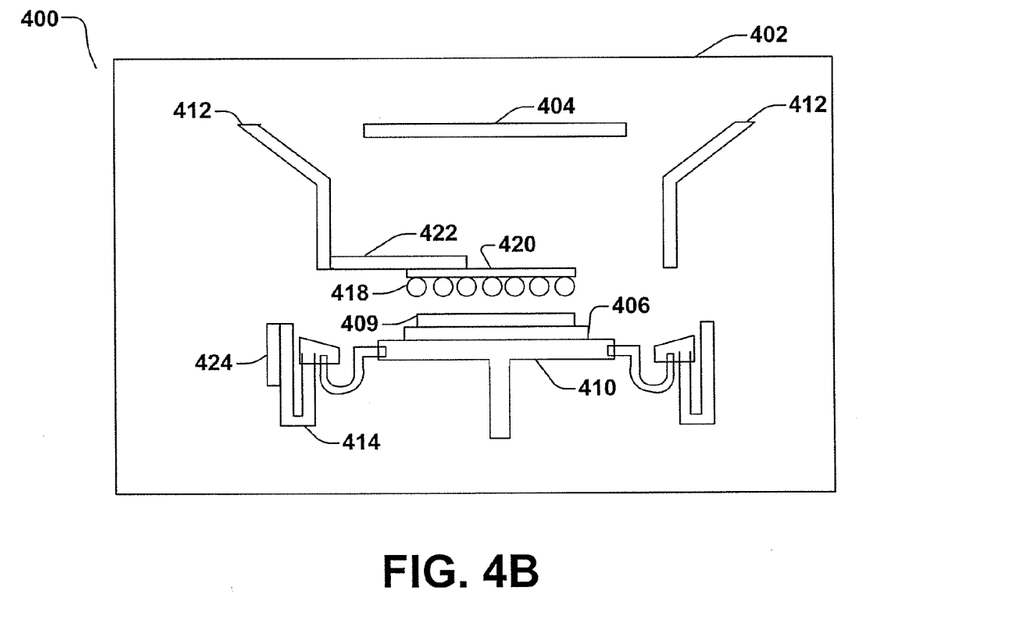
Figure 4C:
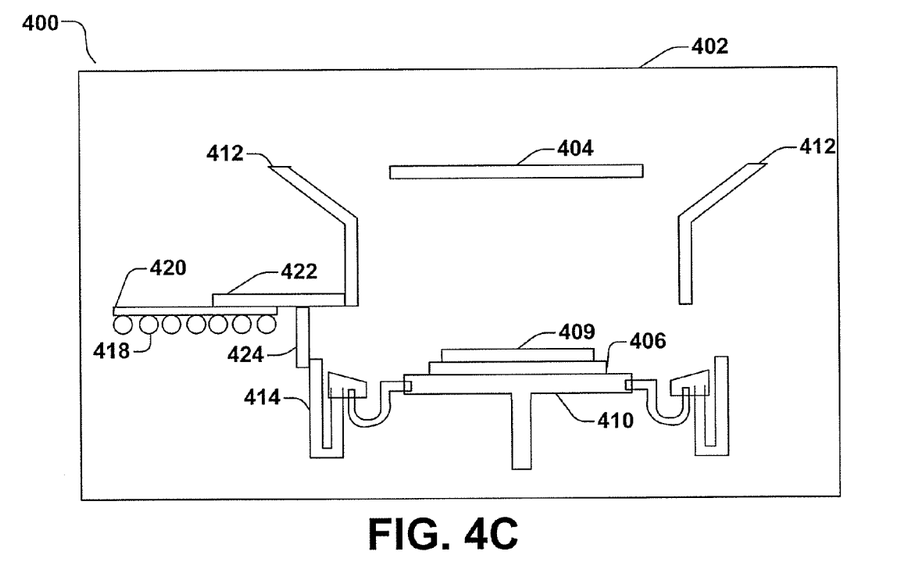

In FIG. 4B, slit valve 424 opens and transfer arm 422 rotates to move lamp modules 418 on mounting bracket 420 into position above metal film 409 on substrate 406. Lamp modules 418 are turned on and substrate 406 is heated to reflow metal film 409. After a predetermined time, lamp modules 418 are turned off and transfer arm 422 rotates to remove lamp modules from processing chamber 400 as illustrated in FIG. 4C. Substrate 406 is then cooled through pedestal 410.

Figure 5:
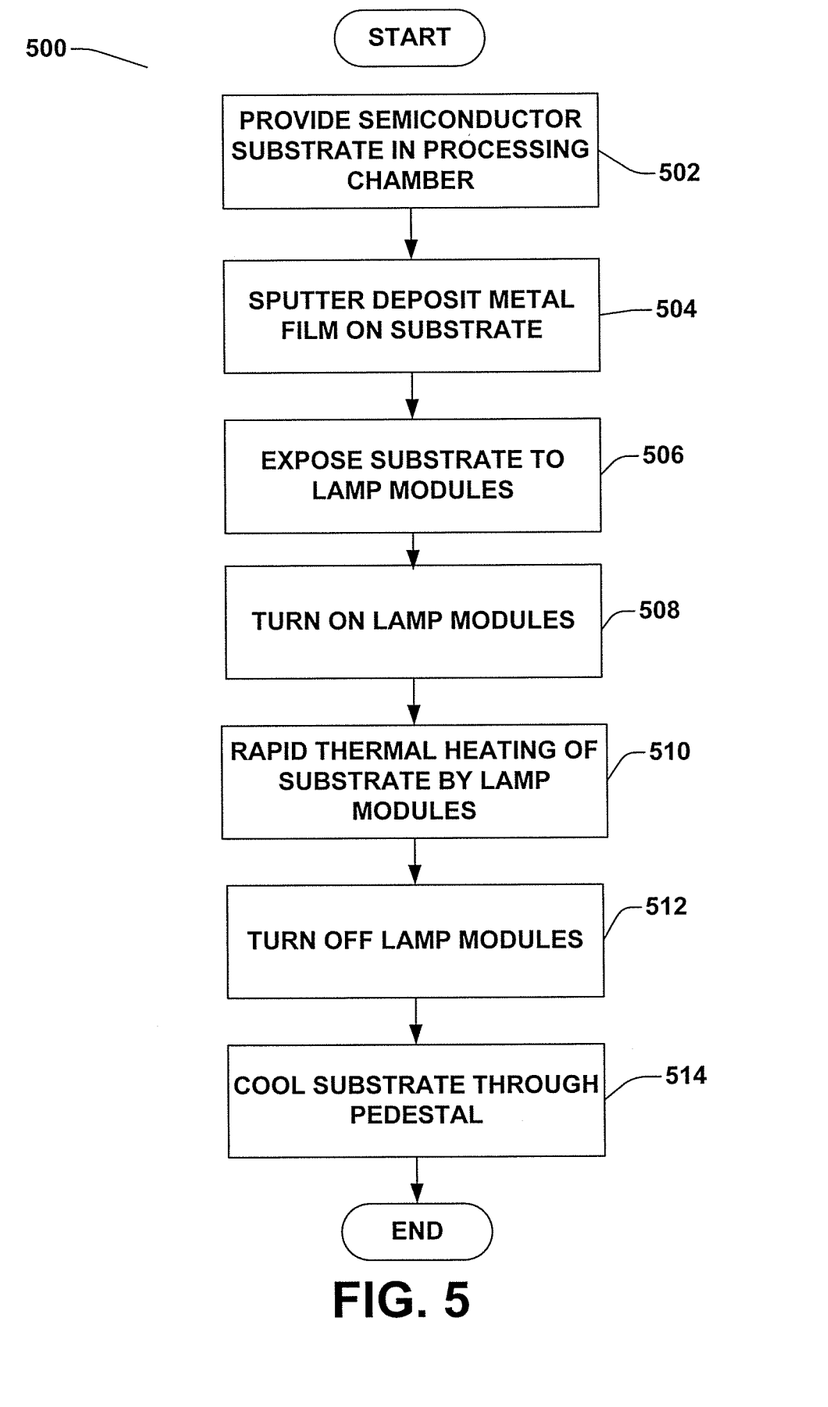
FIG. 5 illustrates a flow diagram of some embodiments of a method for heating a semiconductor substrate in a physical vapor deposition system.

FIG. 5 illustrates a flow diagram of some embodiments of a method 500 for heating a semiconductor substrate in a physical vapor deposition chamber having one or more lamp modules. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502 a semiconductor substrate is provided in a physical vapor deposition chamber having a target configured to provide target atoms to a substrate supported on a pedestal. Target is positioned in opposition to the substrate to be sputtered.

At step 504 a metal film is formed on the substrate by target atoms generated by application of a bias to the target that causes high energy ions from a plasma in the chamber to sputter the target. Target atoms condense on the substrate to form a thin film.

At 506 substrate is exposed to lamp modules. Exposure of the substrate to the one or more lamp modules may occur by movement of the shielding device, movement of the pedestal, reflecting light energy emitted by the lamp modules onto the substrate, or positioning a transfer arm having lamp modules mounted thereto over the substrate.

At step 508 lamp modules are turned on. Light energy emitted by lamp modules may be controlled by a power controller used to increase or decrease the light energy being emitted by the lamps.

At step 510 rapid thermal heating of the substrate by light energy emitted from the lamp modules causes metal film to reflow, thereby promoting the flow of metal film into holes in the substrate formed to provide interconnect features between layers in the substrate.

After some predetermined time, at 512 lamp modules are turned off. The substrate is then cooled by flow of a cooling liquid through a conduit in the pedestal at 514.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a physical vapor deposition system having a process chamber which houses a substrate. A target within the processing chamber is configured to provide target atoms to the processing chamber. At least one heat source comprising one or more lamp modules is configured to heat a surface of the substrate.

In another embodiment, the present disclosure relates to an apparatus a pedestal configured to support the semiconductor substrate, the substrate having a metal film thereon. The apparatus further includes a heat source a comprising one or more lamp modules configured to reflow a metal film that has been deposited on the semiconductor substrate during a physical vapor deposition process. The apparatus further includes a shielding device configured to thermally separate a heat source from the semiconductor substrate.

In another embodiment, the present disclosure relates to a method of heating a semiconductor substrate in a physical vapor deposition chamber. The method comprises supporting a semiconductor substrate having a metal film thereon within the chamber and supported by a pedestal, the process chamber configured to include a shielding device operable to thermally separate a heat source from the semiconductor substrate. The method further comprises exposing the semiconductor substrate to a heat source. The method further comprises heating the semiconductor substrate with the heat source, the heat source comprising one or more lamp modules configured to heat a surface of the substrate.

What is claimed is:

1. A physical vapor deposition system, comprising:
   a processing chamber configured to house a pedestal for supporting a substrate;
   a target configured to provide target atoms to a surface of the substrate; and
   at least one radiant heat source located within the processing chamber comprising one or more lamp modules and configured to direct radiant energy onto the surface of the substrate during a deposition process that provides the target atoms to the surface of the substrate.

2. The physical vapor deposition system of claim 1, further comprising:
   a shielding device;
   wherein the physical vapor deposition system has a first configuration and a second configuration between which the system is switched by a movement of the pedestal, a portion of the shielding device, or a transfer arm supporting the lamp modules;
   in the second configuration the shielding device is configured to protect the lamp modules from sputter deposition by the target atoms from the target;
   in the second configuration, the target is configured for sputter deposition of metal atoms from the target onto a substrate lying flat on a substrate-supporting surface of the pedestal.

3. The physical vapor deposition system of claim 1, further comprising:
   a shielding device configured to protect the lamp modules from sputter deposition by the target atoms from the target; and
   reflectors positioned to reflect radiant energy from the one or more lamp modules onto the surface of the substrate while the shielding device protects the lamp modules from sputter deposition by the target atoms from the target.

4. The physical vapor deposition system of claim 2, wherein:
   the shielding device comprises an upper portion and a lower portion;
   the movement that switches the physical vapor deposition system between the first configuration and the second configuration is a lowering of the lower portion.

5. The physical vapor deposition system of claim 1, wherein:
   the lamp modules comprise a plurality of lamps vertically disposed over the substrate during the deposition process.

6. The physical vapor deposition system of claim 1, wherein the one or more lamp modules provide a wavelength of light in the visible spectrum.

7. The physical vapor deposition system of claim 1, further comprising one or more reflecting devices in association with each lamp module and positioned to direct radiant energy from the lamp module onto a substrate lying flat on a substrate-supporting surface of the pedestal;
   wherein the angle of reflection provided by each of the reflecting devices is independently adjustable; and
   wherein the independent adjustability of the angles of reflection is suitable for improving uniformity in temperature across a substrate supported on the pedestal.

8. The physical vapor deposition system of claim 1, further comprising a shielding device movable to a position in which the shielding device protects the lamp modules from sputter deposition by the target atoms from the target.

9. The physical vapor deposition system of claim 1, further comprising:
   a cooling system configured to move a cooling fluid within the pedestal to cool the substrate supported on the pedestal.

10. The physical vapor deposition system of claim 2, wherein the movement that switches the physical vapor deposition system between the first configuration and the second configuration is a movement of the pedestal.

11. The physical vapor deposition system of claim 10, further comprising:
    a cooling system configured to selectively move a cooling fluid within the pedestal for selective cooling of the substrate.

12. The physical vapor deposition system of claim 2, wherein the movement that switches the physical vapor deposition system between the first configuration and the second configuration is a movement of a transfer arm supporting the lamp modules.

13. The physical vapor deposition system of claim 12, wherein the transfer arm is rotatably moveable.

14. A physical vapor deposition device, comprising:
    a processing chamber configured to house a pedestal for supporting a substrate;
    a target configured to provide target atoms to a surface of the substrate;
    at least one radiant heat source located within the processing chamber configured to direct radiant energy onto the surface of the substrate during a deposition process that provides the target atoms to the surface of the substrate; and a shielding element having vertical sidewalls, perpendicular to the surface of the substrate, which laterally separate the at least one radiant heat source from a position that is vertically disposed between the target and the substrate.

15. The physical vapor deposition device of claim 14, wherein the shielding element comprises a mobile shielding element disposed at a first position that laterally separates the pedestal from the at least one radiant heat source during a first mode of operation, and disposed at a second position that laterally separates the pedestal from the at least one radiant heat source during a second mode of operation.

16. The physical vapor deposition device of claim 14, wherein the shielding element comprises a static shielding element that extends from a vertical position aligned with the target to a vertical position between the target and the substrate.

17. A physical vapor deposition device, comprising:
a processing chamber configured to house a pedestal for supporting a substrate;
a target configured to provide target atoms to a surface of the substrate;
a plurality of radiant heat sources located on opposing sides of the pedestal and within the processing chamber and configured to direct radiant energy onto the surface of the substrate; and
wherein the radiant heat sources are located at positions that are vertically located between the target and the substrate during a deposition process that provides the target atoms to the surface of the substrate.

18. The physical vapor deposition device of claim 17, wherein the at least one radiant heat source is in communication with the target during deposition so that the at least one radiant heat source is able to heat the substrate during the deposition process.

19. The physical vapor deposition device of claim 17, further comprising a shielding element comprising a mobile shielding element disposed at a first position that laterally separates the pedestal from the at least one radiant heat source during a first mode of operation, and disposed at a second position that laterally separates the pedestal from the at least one radiant heat source during a second mode of operation.

20. The physical vapor deposition device of claim 17, further comprising a shielding element comprising a static shielding element, comprising an upper shielding portion and a lower shielding portion that is distinct from the upper shielding portion; and
wherein one or more lamp modules are vertically positioned between the upper shielding portion and the lower shielding portion.

* * * * *